(12) United States Patent
Sunila

(10) Patent No.: US 12,323,831 B2
(45) Date of Patent: Jun. 3, 2025

(54) ANTENNA ANALYSIS IN COMMUNICATION NETWORKS

(71) Applicant: Elisa Oyj, Helsinki (FI)

(72) Inventor: Karri Sunila, Helsinki (FI)

(73) Assignee: Elisa Oyj, Helsinki (FI)

( * ) Notice: Subject to any disclaimer, the term of this patent is extended or adjusted under 35 U.S.C. 154(b) by 574 days.

(21) Appl. No.: 17/795,766

(22) PCT Filed: Feb. 15, 2021

(86) PCT No.: PCT/FI2021/050101
§ 371 (c)(1),
(2) Date: Jul. 27, 2022

(87) PCT Pub. No.: WO2021/176132
PCT Pub. Date: Sep. 10, 2021

(65) Prior Publication Data
US 2023/0061081 A1    Mar. 2, 2023

(30) Foreign Application Priority Data
Mar. 5, 2020    (FI) ..................................... 20205234

(51) Int. Cl.
*H04W 24/08*    (2009.01)
*G01R 29/08*    (2006.01)

(52) U.S. Cl.
CPC ........ *H04W 24/08* (2013.01); *G01R 29/0871* (2013.01)

(58) Field of Classification Search
CPC ..... H04W 24/08; H04W 88/10; H04W 24/04; H04W 64/006; G01R 29/0871;
(Continued)

(56) References Cited

U.S. PATENT DOCUMENTS

2008/0261535 A1* 10/2008 Weil .................... H04B 17/309
455/67.11
2010/0321154 A1* 12/2010 Ghabra .................. B60R 25/00
340/5.61
(Continued)

FOREIGN PATENT DOCUMENTS

CN    106972269 A    7/2017
WO    2007114745 A1    10/2007

OTHER PUBLICATIONS

Finnish Patent and Registration Office, Search Report, Application No. 20205234, mailed Sep. 29, 2020, 1 page.
(Continued)

*Primary Examiner* — Hoang-Chuong Q Vu
(74) *Attorney, Agent, or Firm* — Ziegler IP Law Group, LLC.

(57) ABSTRACT

A computer implemented method of antenna analysis for a base station site of a communication network. The base station site serves at least a cell operating according to a first network technology and a cell operating according to a second network technology. The method includes receiving, from the base station site, performance data related to the first network technology and performance data related to the second network technology; analyzing the received performance data to check if the performance data indicates an antenna related performance problem; and outputting an indication of an antenna problem responsive to detecting an antenna related performance problem both in the performance data related to the first network technology and the performance data related to the second network technology.

20 Claims, 4 Drawing Sheets

(58) Field of Classification Search
CPC ... H04B 17/18; H04B 17/318; H04L 41/0677; H04L 43/0817; H04L 43/16
See application file for complete search history.

(56) References Cited

U.S. PATENT DOCUMENTS

| | | | |
|---|---|---|---|
| 2013/0308608 A1* | 11/2013 | Hu | H04W 72/542 |
| | | | 370/334 |
| 2013/0344831 A1 | 12/2013 | Yuan et al. | |
| 2014/0194113 A1* | 7/2014 | Ahlstrom | H04B 17/17 |
| | | | 455/423 |
| 2015/0245226 A1* | 8/2015 | Lewallen | H04W 40/34 |
| | | | 370/225 |
| 2016/0174081 A1 | 6/2016 | Lau | |
| 2017/0171757 A1* | 6/2017 | Smith | H04W 12/082 |
| 2018/0026664 A1* | 1/2018 | Greene | H04B 1/0057 |
| | | | 370/252 |
| 2019/0140706 A1 | 5/2019 | Chang et al. | |
| 2019/0239101 A1* | 8/2019 | Ouyang | G06N 3/084 |
| 2020/0059800 A1 | 2/2020 | Menon et al. | |

OTHER PUBLICATIONS

International Search Report and Written Opinion, European Patent Office, Application No. PCT/FI2021/050101, mailed May 21, 2021, 15 pages.

\* cited by examiner

ANTENNA ANALYSIS IN COMMUNICATION NETWORKS

TECHNICAL FIELD

The present application generally relates to antenna analysis in communication networks.

BACKGROUND

This section illustrates useful background information without admission of any technique described herein representative of the state of the art.

Cellular communication networks comprise a plurality of cells serving users of the network. When users of the communication network move in the area of the network, connections of the users are seamlessly handed over between cells of the network. In order for the communication network to operate as intended, cells of the communication network need to provide sufficient coverage without too much interfering with operation of neighboring cells.

Antennas and their radiation patterns are one important factor affecting operation of cellular networks. Networks are designed based on the assumption that antennas (and likewise other network components) behave according to their specifications. Unfortunately, this is not always the case.

There are various automated measures that monitor operation of the communication networks in order to detect any problems in operation of the network as soon as possible so that corrective actions can be taken. The challenge is that there are problem situations that are not detected by current automated monitoring arrangements and therefore there is room for further development of the automated monitoring arrangements.

Now a new approach is taken to analyzing operation of antennas in communication networks.

SUMMARY

Various aspects of examples of the invention are set out in the claims. Any devices and/or methods in the description and/or drawings which are not covered by the claims are examples useful for understanding the invention.

According to a first example aspect of the present invention, there is provided a computer implemented method of antenna analysis for a base station site of a communication network. The base station site serves at least a cell operating according to a first network technology and a cell operating according to a second network technology. The method comprises receiving, from the base station site, performance data related to the first network technology and performance data related to the second network technology;

analyzing the received performance data to check if the performance data indicates an antenna related performance problem; and outputting an indication of an antenna problem responsive to detecting an antenna related performance problem both in the performance data related to the first network technology and the performance data related to the second network technology.

In an example embodiment, one antenna line in the base station site serves the cell operating according to the first network technology and the cell operating according to the second network technology, and the indication of an antenna problem indicates a problem in said antenna line.

In an example embodiment, different antenna lines in the base station site serve the cell operating according to the first network technology and the cell operating according to the second network technology, and the indication of an antenna problem indicates a problem in whole antenna.

In an example embodiment, one antenna line in the base station site serves the cell operating according to the first network technology and the cell operating according to the second network technology, and absence of an antenna related performance problem in the performance data related to the first network technology or the performance data related to the second network technology results in outputting an indication of no antenna problem.

In an example embodiment, outputting the indication of an antenna problem requires detecting substantially similar antenna related problem both in the performance data related to the first network technology and the performance data related to the second network technology.

In an example embodiment, the performance data comprises at least information relating to signal levels. The information relating to signal levels may comprise at least information relating to signal level received at user device locations and/or information relating to transmission power used by user devices in the respective cell. The performance data may further comprise information relating to distance of user device locations from the base station site.

In an example embodiment, the detection of the antenna related performance problem is based on comparing the information relating to signal levels to predefined thresholds. The thresholds may depend on distance of the user device locations from the base station site.

In an example embodiment, the detection of the antenna related performance problem is further based on detecting that certain number or certain percentage of samples (user device locations) trigger the threshold(s).

In an example embodiment, the detection of the antenna related performance problem is based on detecting that a plurality of user device locations experience bad field conditions and/or use increased transmission power.

In an example embodiment, the detection of the antenna related performance problem is based on detecting that number of user device locations that experience bad field conditions and/or use increased transmission power exceeds a threshold.

In an example embodiment, the detection of the antenna related performance problem is based on detecting a plurality of user device locations near the base station site experiencing bad field conditions and/or using increased transmission power.

In an example embodiment, the detection of the antenna related performance problem is based on detecting a plurality of user device locations closer to the base station site than outer border of the respective cell using increased transmission power.

In an example embodiment, the detection of the antenna related performance problem is based on detecting that number of user device locations experiencing good field conditions does not reach a threshold.

In an example embodiment, the detection of the antenna related performance problem is based on detecting that number of user device locations closer to the base station site than outer border of the respective cell experiencing good field conditions does not reach a threshold.

In an example embodiment, analyzing the received performance data requires that performance data comprises data relating to a plurality of user devices. For example, about 5000 samples may be required.

According to a second example aspect of the present invention, there is provided an apparatus comprising a processor and a memory including computer program code; the memory and the computer program code configured to, with the processor, cause the apparatus to perform the method of the first aspect or any related embodiment.

According to a third example aspect of the present invention, there is provided a computer program comprising computer executable program code which when executed by a processor causes an apparatus to perform the method of the first aspect or any related embodiment.

The computer program of the third aspect may be a computer program product stored on a non-transitory memory medium.

Different non-binding example aspects and embodiments of the present invention have been illustrated in the foregoing. The embodiments in the foregoing are used merely to explain selected aspects or steps that may be utilized in implementations of the present invention. Some embodiments may be presented only with reference to certain example aspects of the invention. It should be appreciated that corresponding embodiments may apply to other example aspects as well.

BRIEF DESCRIPTION OF THE DRAWINGS

For a more complete understanding of example embodiments of the present invention, reference is now made to the following descriptions taken in connection with the accompanying drawings in which.

DETAILED DESCRIPTION OF THE DRAWINGS

Example embodiments of the present invention and its potential advantages are understood by referring to FIGS. 1 through 5 of the drawings. In this document, like reference signs denote like parts or steps.

Example embodiments of the invention provide new mechanisms to analyze operation of communication networks in order to find antenna related problems. There may be for example faulty components in antenna lines (e.g. faulty connectors, faulty antenna dipoles etc), external obstacles causing problems in antenna operation, faulty radiation patterns etc. All of these may cause problems with performance of the network e.g. by causing problems with throughput, dominance areas, and/or handovers.

Certain example embodiments of the invention are based on comparing performance data related to different network technologies served by the same base station site to identify potential antenna problems. If cells of different network technologies use the same physical antenna components, the different network technologies should show similar problems, if there is a problem in the antenna.

Figure 1:
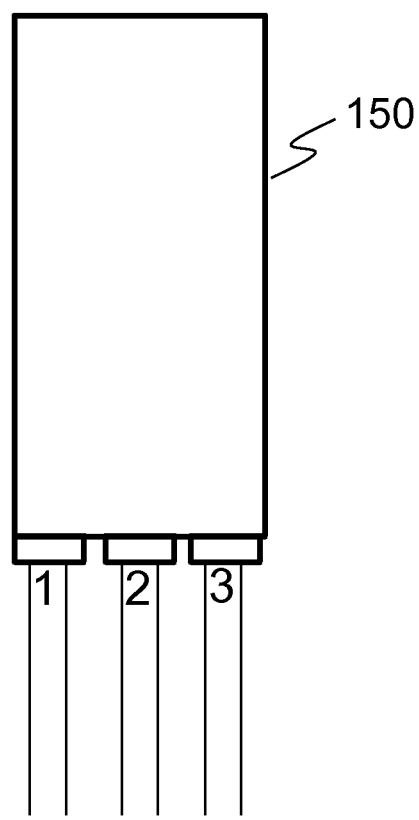
FIG. 1 shows an example antenna element.

FIG. 1 shows an example antenna element 150 comprising three antenna ports 1, 2 and 3. Each port relates to an antenna line comprising connectors, antenna dipoles and other physical components. One antenna line may serve one or more cells operating according to different network technologies. For example, antenna port 1 may serve GSM900 and LTE800 technologies, antenna port 2 may serve LTE1800 and LTE2100 technologies, and antenna port 3 may serve LTE2600 technology. Now if performance data related to GSM900 and LTE800 indicate substantially similar antenna related problem, it is likely that there may be for example a faulty component in the antenna line of antenna port 1 or some other problem with the antenna line of antenna port 1. In such case, automatic analysis according to an example embodiment outputs an indication of an antenna problem in antenna line associated with the antenna port 1. Whereas, if only performance data related to GSM900 or to LTE800 indicates a problem, or if problems associated with GSM900 and LTE800 are substantially different, it is concluded that there is no problem in antenna line associated with the antenna port 1, but somewhere else instead and a corresponding indication may be output. Likewise, if performance data related to cells using different ports of the antenna element 150 indicate substantially similar antenna related problem, it is likely that the whole antenna element is faulty or wrongly installed, and an indication of an antenna problem in the whole antenna element 150 may be output.

It is to be noted that in the following, mainly monitoring of a single base station site is discussed, but clearly plurality of base station sites may be monitored correspondingly in parallel or sequentially one after another.

Figure 2A:
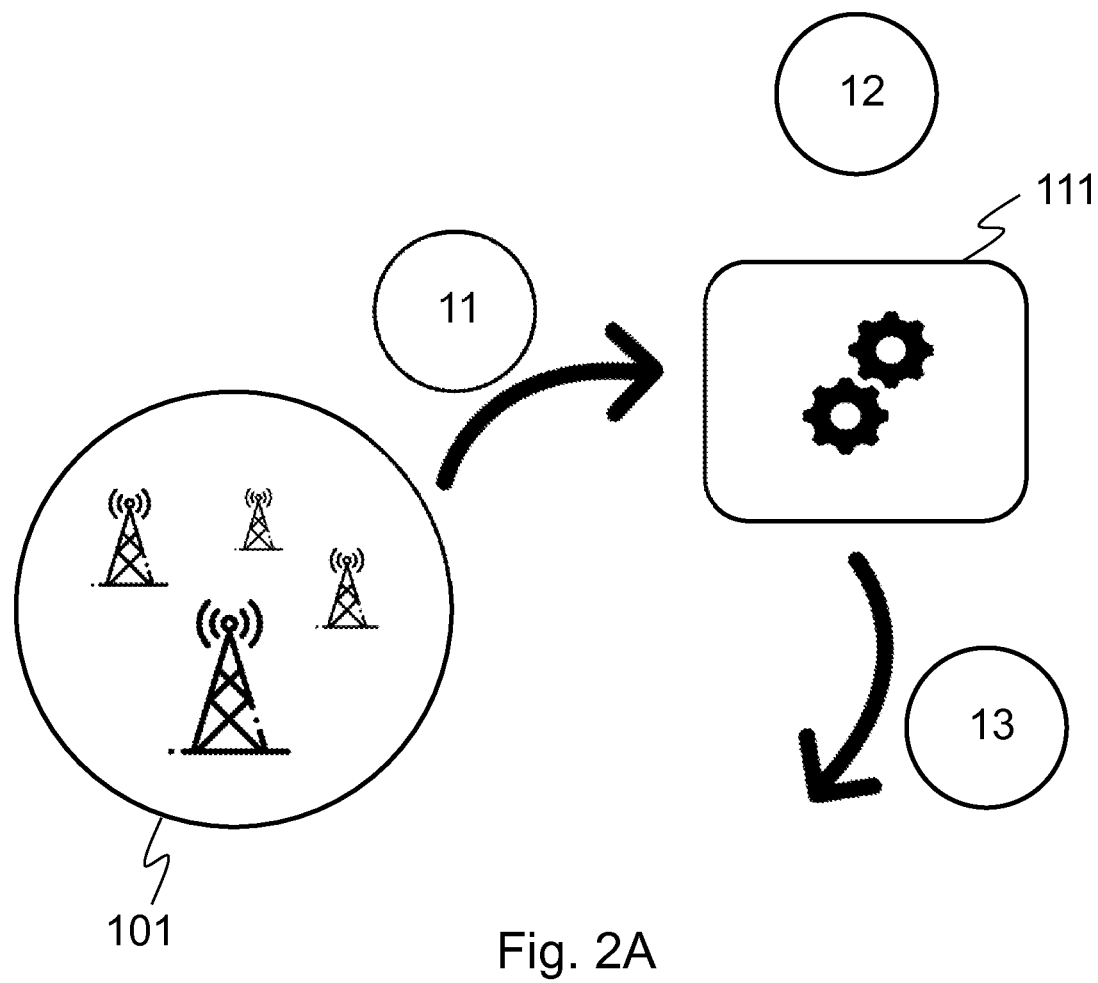
FIG. 2A shows an example scenario according to an embodiment.

FIG. 2A shows an example scenario according to an embodiment. The scenario shows a communication network 101 comprising a plurality of cells and base station sites and other network devices, and an automation system 111 configured to implement automatic monitoring according to example embodiments.

In an embodiment of the invention the scenario of FIG. 2A operates as follows: In phase 11, the automation system 111 obtains performance data from a cells of a base station site of the network. In an embodiment the data comprises at least information relating to signal level. The performance data may comprise information about signal level received at the user devices and/or information about transmission signal level used by the user devices. Further the performance data may comprise information relating to distance of user devices from the base station site. The data may be obtained directly from the cells or through some intermediate system. Also other data may be obtained from the cells.

In phase 12, the automation system 111 uses the received performance data to monitor and analyze operation of the cells to detect problems in operation of one or more antenna lines of the base station site.

In phase 13, any determined problems are output for further actions such as for example maintenance of the base station site.

The process may be manually or automatically triggered. The process may be periodically repeated. The process may be repeated for example once a day, every other day, every three days, once a week, every two weeks, or once a month. By periodically repeating the process, effective network monitoring is achieved and problems, if any, may be timely detected. Additionally or alternatively, the process may be triggered, for example, in response to observing a performance problem or degradation in the network or in a particular area or cell. Still further, the process may be performed in connection with deployment of new cells or base station site, deployment of new physical equipment in the base station site and/or maintenance actions performed in the base station site. In this way any problems with the newly deployed equipment may be detected right away.

Figure 2B:
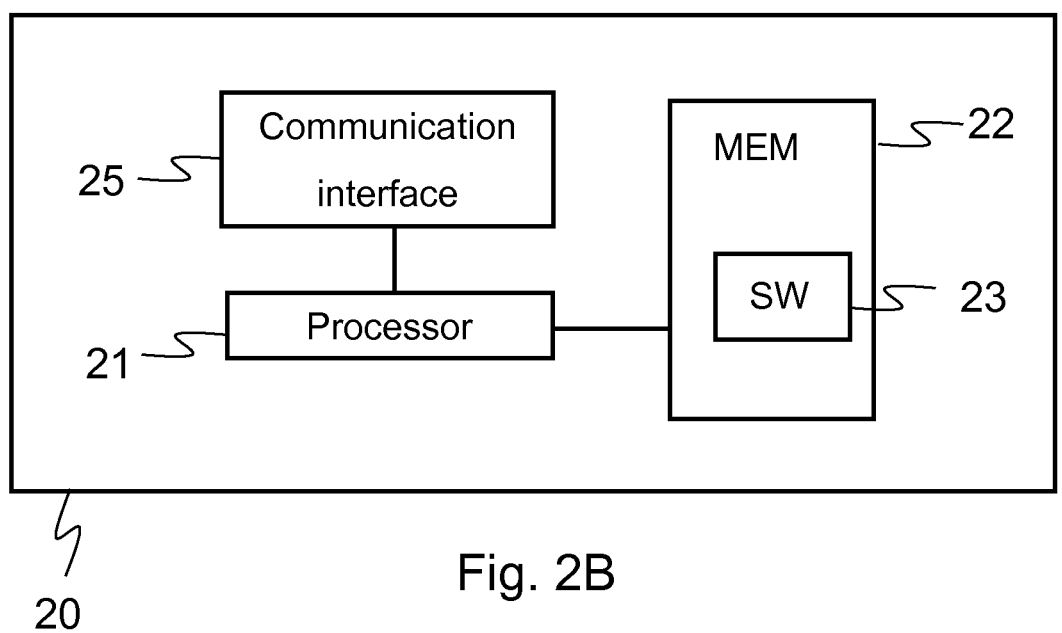
FIG. 2B shows an apparatus according to an embodiment.

FIG. 2B shows an apparatus 20 according to an embodiment. The apparatus 20 is for example a general-purpose computer or server or some other electronic data processing apparatus. The apparatus 20 can be used for implementing embodiments of the invention. That is, with suitable configuration the apparatus 20 is suited for operating for example as the automation system 111 of foregoing disclosure.

The general structure of the apparatus 20 comprises a processor 21, and a memory 22 coupled to the processor 21. The apparatus 20 further comprises software 23 stored in the memory 22 and operable to be loaded into and executed in the processor 21. The software 23 may comprise one or more software modules and can be in the form of a computer program product. Further, the apparatus 20 comprises a communication interface 25 coupled to the processor 21.

The processor 21 may comprise, e.g., a central processing unit (CPU), a microprocessor, a digital signal processor (DSP), a graphics processing unit, or the like. FIG. 2 shows one processor 21, but the apparatus 20 may comprise a plurality of processors.

The memory 22 may be for example a non-volatile or a volatile memory, such as a read-only memory (ROM), a programmable read-only memory (PROM), erasable programmable read-only memory (EPROM), a random-access memory (RAM), a flash memory, a data disk, an optical storage, a magnetic storage, a smart card, or the like. The apparatus 20 may comprise a plurality of memories.

The communication interface 25 may comprise communication modules that implement data transmission to and from the apparatus 20. The communication modules may comprise, e.g., a wireless or a wired interface module. The wireless interface may comprise such as a WLAN, Bluetooth, infrared (IR), radio frequency identification (RF ID), GSM/GPRS, CDMA, WCDMA, LTE (Long Term Evolution) or 5G radio module. The wired interface may comprise such as Ethernet or universal serial bus (USB), for example. Further the apparatus 20 may comprise a user interface (not shown) for providing interaction with a user of the apparatus. The user interface may comprise a display and a keyboard, for example. The user interaction may be implemented through the communication interface 25, too.

A skilled person appreciates that in addition to the elements shown in FIG. 2B, the apparatus 20 may comprise other elements, such as displays, as well as additional circuitry such as memory chips, application-specific integrated circuits (ASIC), other processing circuitry for specific purposes and the like. Further, it is noted that only one apparatus is shown in FIG. 2B, but the embodiments of the invention may equally be implemented in a cluster of shown apparatuses.

Figure 3:
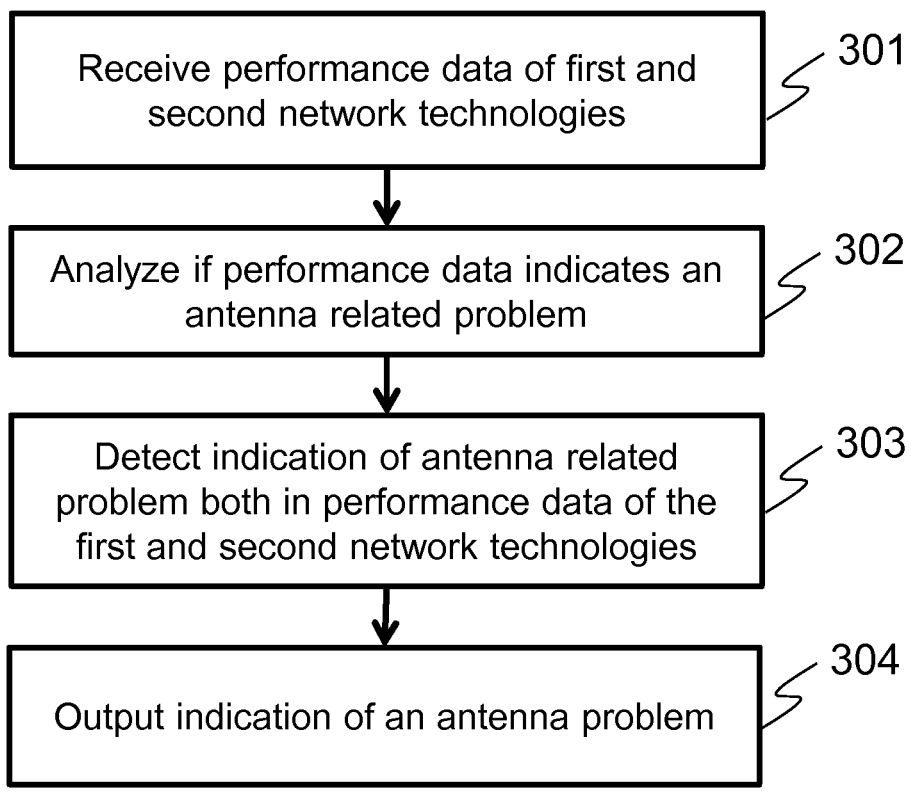
FIGS. 3-5 show flow diagrams illustrating example methods according to certain embodiments.
Figure 4:
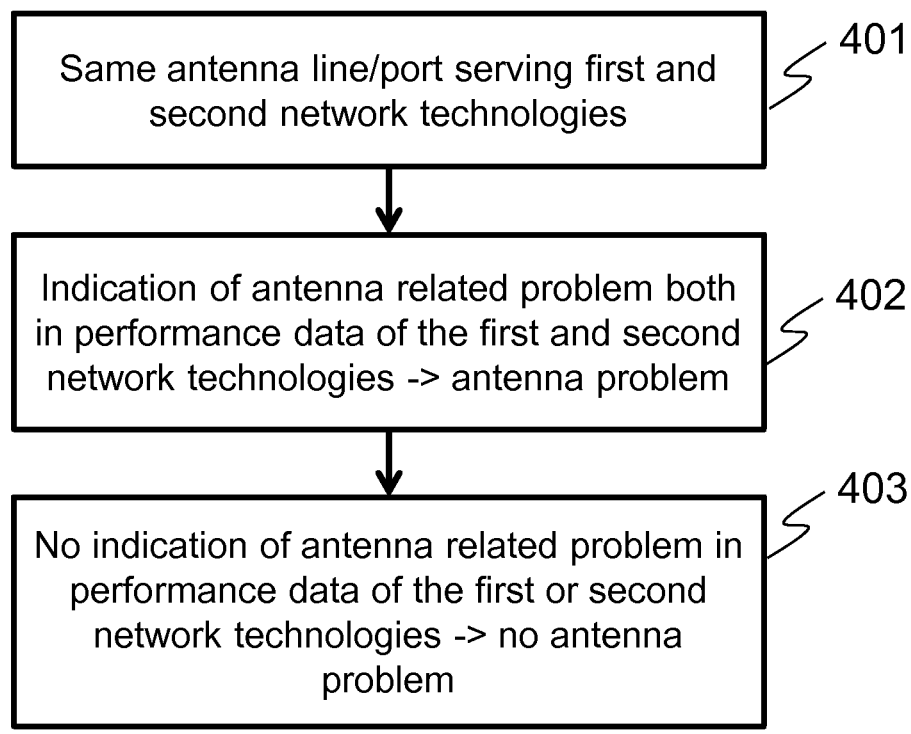
Figure 5:
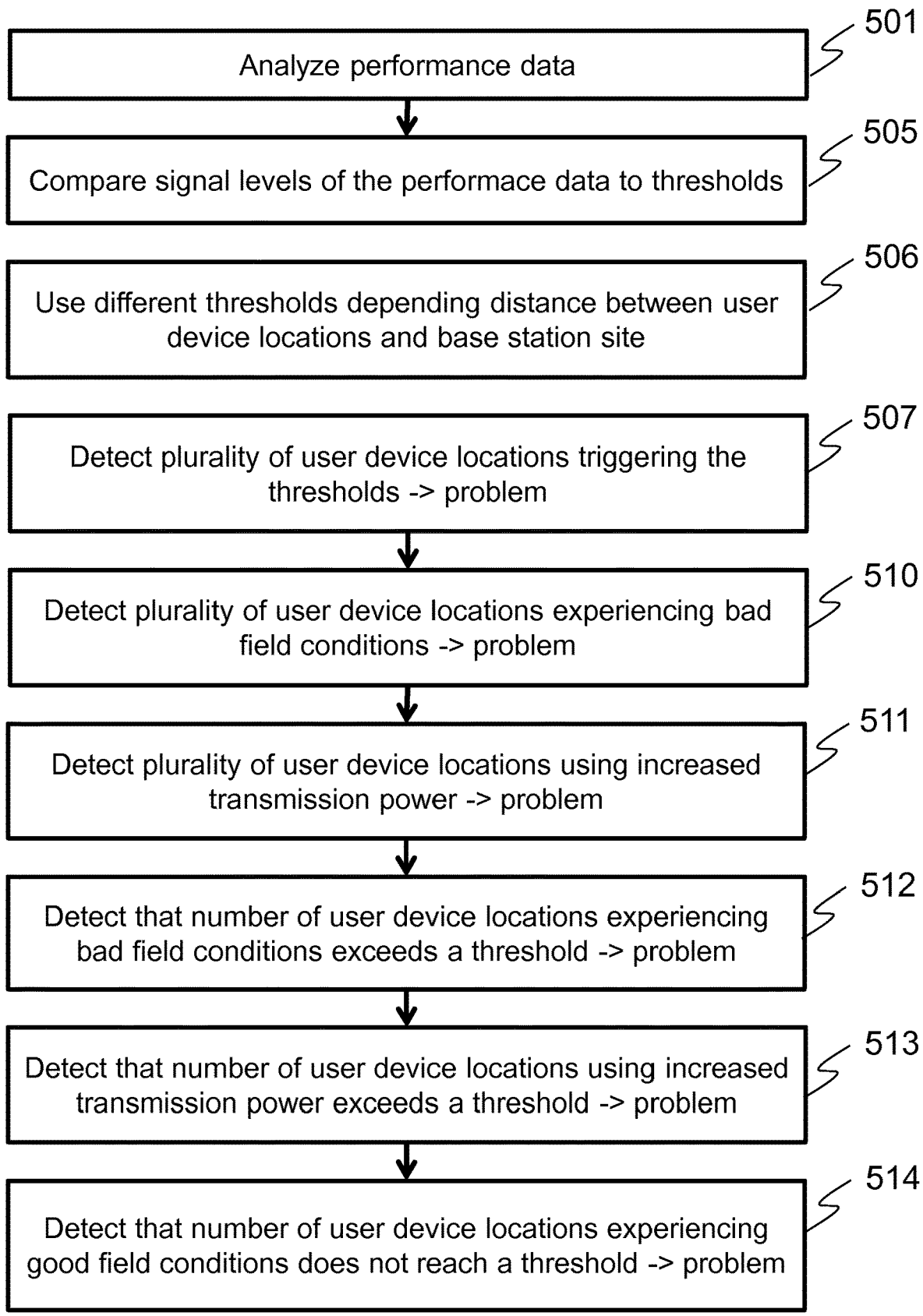

FIGS. 3-5 show flow diagrams illustrating example methods according to certain embodiments. The methods may be implemented in the automation system 111 of FIG. 2A and/or in the apparatus 20 of FIG. 2B. The methods are implemented in a computer and do not require human interaction unless otherwise expressly stated. It is to be noted that the methods may however provide output that may be further processed by humans and/or the methods may require user input to start. Different phases shown in FIGS. 3-5 may be combined with each other and the order of phases may be changed except where otherwise explicitly defined. Furthermore, it is to be noted that performing all phases of the flow charts is not mandatory.

The method of FIG. 3 provides antenna analysis for a base station site of a communication network. The base station site serves at least a cell operating according to a first network technology and a cell operating according to a second network technology. These cells may use the same or different antenna line/antenna port in the base station site and there may exist also other cells that operate according to other network technologies. The method comprises following phases:

Phase 301: Performance data related to the first network technology and performance data related to the second network technology are received from respective cells. In an embodiment, the performance data comprises at least information relating to distance of user devices from the base station site and information relating to signal level. In an embodiment, the performance data comprises information about signal level received at the user devices and/or information about transmission signal level used by the user devices.

Phase 302: The received performance data is analyzed to check if the performance data indicates an antenna related performance problem.

Phase 303: It is detected that there is an antenna related performance problem both in the performance data related to the first network technology and the performance data related to the second network technology. In an embodiment, it is required that the problem is substantially similar both in the performance data related to the first network technology and the performance data related to the second network technology.

Phase 304: An indication of an antenna problem is output. Based on this maintenance personnel may be easily directed to correct place to find faulty components or otherwise faulty equipment. It is to be noted that, if a problem is detected in the performance data related to the first network technology but not in the performance data related to the second network technology, or vice versa, or if the problems related to the first and the second network technology are substantially different, it is concluded that there is no antenna problem and a corresponding indication may be output.

The method of FIG. 4 provides further details of an example of antenna analysis for a base station site of a communication network. The method comprises following phases:

Phase 401: Same antenna line/antenna port in the base station site serves the cell operating according to the first network technology and the cell operating according to the second network technology.

Phase 402: Indication of antenna related performance problem is detected both in performance data of the first and second network technologies and responsively an indication of an antenna problem is output. More specifically, the indication of an antenna problem may indicate a problem in the antenna line.

Phase 403: Indication of antenna related performance problem is not detected in performance data of the first or second network technologies and responsively an indication of no antenna problem is output. More specifically, the indication of no antenna problem may indicate that the antenna line is likely operating as it should. That is, in this case problems are not detected in both network technologies, but it is possible that problems are detected in one or the other network technology.

In case different antenna lines/antenna ports in the base station site serve the cell operating according to the first network technology and the cell operating according to the second network technology, the indication of an antenna problem may indicate a problem in whole antenna (as there is problem with at least two antenna lines/antenna ports).

The method of FIG. 5 provides further details of an example analysis of the performance data to detect antenna related performance problems. The method comprises following phases:

Phase 501: Performance data is analyzed.

Phase 505: The performance data comprises at least information about signal levels and the signal levels are compared to predefined thresholds. As a result, it is detected if user device locations in the respective cell experience bad field conditions, good field conditions and/or use increased transmission power (transmission power of the user device or transmission power of the base station).

Phase 506: Different thresholds are used depending on distance between the user device locations and the base station site. For example, it is normal that received signal level is better near the base station site than further away from the base station site (e.g. near the cell border). Likewise, it is normal that used transmission power is higher further away from the base station site (e.g. near the cell border) than closer to the base station site.

Phase 507: It is detected that a plurality of user device locations triggers the thresholds of phases 505 and 506. Responsively it is determined that there is antenna related performance problem. It may be required that for example about 5000 or 95-98% of samples (user device locations) trigger the thresholds. By requiring certain amount of samples, analysis is not performed in cells with only very few users, where performance data may be related to individual user devices or locations of individual user devices instead of providing statistically sufficient amount of data.

Phase 510: It is detected that a plurality of user device locations experience bad field conditions and responsively it is determined that there is antenna related performance problem. Bad field conditions may refer for example to a situation where received signal strength is worse than a threshold, i.e. worse than expected in the corresponding user location. It may be required that majority of user device locations in the respective cell experience the bad field conditions to determined that there is antenna related performance problem as even in normal operation there are likely user devices that do experience bad field conditions (e.g. user devices near cell border or in otherwise challenging location, such as a cellar). On the other hand, if all or almost all user devices experience bad field conditions, i.e. there are no user devices in good field conditions, there is likely something wrong.

Phase 511: It is detected that a plurality of user device locations use increased transmission power and responsively it is determined that there is antenna related performance problem. Increased transmission power may refer for example to a situation where transmission power is above average, near maximum or at maximum.

Phase 512: It is detected that number of user device locations experiencing bad field conditions exceeds a threshold, and responsively it is determined that there is antenna related performance problem. The threshold may be certain percentage of the user device locations in the cell (e.g. 97-99% of user device locations). Bad field conditions may refer for example to a situation where received signal strength is worse than a threshold.

Phase 513: It is detected that number of user device locations that use increased transmission power exceeds a threshold, and responsively it is determined that there is antenna related performance problem. The threshold may be certain percentage of the user device locations in the cell (e.g. 96% or 95-97% of user device locations). Increased transmission power may refer for example to a situation where transmission power is above average, near maximum or at maximum.

Phase 514: It is detected that number of user device locations experiencing good field conditions does not reach a threshold, and responsively it is determined that there is antenna related performance problem. The threshold may be certain percentage of the user device locations in the cell (e.g. 10% or 7-15% of user device locations in city environment, or e.g. 2-5% of user device locations in rural areas). Good field conditions may refer for example to a situation where received signal strength is better than a threshold.

It is to be noted that one or more of phases 505-507 and 510-514 may result in antenna related performance problem being detected. Further, it is to be noted that triggering one of the conditions defined in phases 505-507 and 510-514 suffices for detection of an antenna related performance problem. That is, phases 505-507 and 510-514 may be seen as alternatives to each other.

The phases 510-514 may further take into account user device location in relation to the base station site, and the thresholds may be different depending on the distance to the base station site. For example, detecting a plurality of user device locations near the base station site experiencing bad field conditions and/or using increased transmission power may result in antenna related performance problem being detected. Additionally or alternatively, detecting a plurality of user device locations closer to the base station site than outer border of the respective cell experiencing bad field conditions and/or using increased transmission power may result in antenna related performance problem being detected. Still further, detecting that number of user device locations closer to the base station site than outer border of the respective cell experiencing good field conditions does not reach a threshold may result in antenna related performance problem being detected.

The following provides a detailed example of performance data and performance data thresholds used in connection with analyzing GSM and LTE technologies.

For GSM technology, the performance data that is used in an embodiment may comprise the following:

Ue-KPI: Information relating to transmission power used by a user device; ratio of samples with high transmission power level to samples with all available transmission power levels; can be calculated for example as 100*(power.MS_POWER_LEVEL_0+power.MS_POWER_LEVEL_5)/sum(power.MS_POWER_LEVEL_0+ . . . +power.MS_POWER_LEVEL_31)

RSRP-KPI: Information relating to received signal level; ratio of worst signal level samples up to XdB to all signal level samples exceeds predefined percentage; X can be solved from (Signal level −110 dB+ . . . +signal level XdB)/all_signal_level samples>95%

Timing advance (TA): distance from base station site in kilometers

Number of all TA samples

LTE provides a power headroom parameter that relates to transmission power used by user devices.

Power headroom indicates how much transmission power is left for a UE to use in addition to the power being used by current transmission. Power Headroom=UE Max Transmission Power−PUSCH Power If value of the power headroom parameter is negative, it indicates that the UE is transmitting at a greater power level than it is allowed to transmit.

For LTE technology, the performance data that is used in an embodiment may comprise the following:

Ue-KPI: Information relating to transmission power used by a user device; can be based on power headroom parameter such as average power headroom, which indicates how much transmission power is left for a UE to use in addition to the power being used by current transmission In an example, the Ue-KPI (avg_UE_PWR_HEADR_PUSCH) can be calculated as Sum(1*p.UE_PWR_HEADROOM_PUSCH_LEVEL1+2*p.UE_PWR_HEADROOM_PUSCH_LEVEL2+3*p.UE_PWR_HEADROOM_PUSCH_LEVEL3+
4*p.UE_PWR_HEADROOM_PUSCH_LEVEL4+
5*p.UE_PWR_HEADROOM_PUSCH_LEVEL5+
6*p.UE_PWR_HEADROOM_PUSCH_LEVEL6+
7*p.UE_PWR_HEADROOM_PUSCH_LEVEL7+
8*p.UE_PWR_HEADROOM_PUSCH_LEVEL8+
9*p.UE_PWR_HEADROOM_PUSCH_LEVEL9+
10*p.UE_PWR_HEADROOM_PUSCH_LEVEL10+
11*p.UE_PWR_HEADROOM_PUSCH_LEVEL11+
12*p.UE_PWR_HEADROOM_PUSCH_LEVEL12+
13*p.UE_PWR_HEADROOM_PUSCH_LEVEL13+
14*p.UE_PWR_HEADROOM_PUSCH_LEVEL14+
15*p.UE_PWR_HEADROOM_PUSCH_LEVEL15+
16*p.UE_PWR_HEADROOM_PUSCH_LEVEL16+
17*p.UE_PWR_HEADROOM_PUSCH_LEVEL17+
18*p.UE_PWR_HEADROOM_PUSCH_LEVEL18+
19*p.UE_PWR_HEADROOM_PUSCH_LEVEL19+
20*p.UE_PWR_HEADROOM_PUSCH_LEVEL20+
21*p.UE_PWR_HEADROOM_PUSCH_LEVEL21+
22*p.UE_PWR_HEADROOM_PUSCH_LEVEL22+
23*p.UE_PWR_HEADROOM_PUSCH_LEVEL23+
24*p.UE_PWR_HEADROOM_PUSCH_LEVEL24+
25*p.UE_PWR_HEADROOM_PUSCH_LEVEL25+
26*p.UE_PWR_HEADROOM_PUSCH_LEVEL26+
27*p.UE_PWR_HEADROOM_PUSCH_LEVEL27+
28*p.UE_PWR_HEADROOM_PUSCH_LEVEL28+
29*p.UE_PWR_HEADROOM_PUSCH_LEVEL29+
30*p.UE_PWR_HEADROOM_PUSCH_LEVEL30)/
sum
(p.UE_PWR_HEADROOM_PUSCH_LEVEL1+
p.UE_PWR_HEADROOM_PUSCH_LEVEL2+
p.UE_PWR_HEADROOM_PUSCH_LEVEL3+
p.UE_PWR_HEADROOM_PUSCH_LEVEL4+
p.UE_PWR_HEADROOM_PUSCH_LEVEL5+
p.UE_PWR_HEADROOM_PUSCH_LEVEL6+
p.UE_PWR_HEADROOM_PUSCH_LEVEL7+
p.UE_PWR_HEADROOM_PUSCH_LEVEL8+
p.UE_PWR_HEADROOM_PUSCH_LEVEL9+
p.UE_PWR_HEADROOM_PUSCH_LEVEL10+
p.UE_PWR_HEADROOM_PUSCH_LEVEL11+
p.UE_PWR_HEADROOM_PUSCH_LEVEL12+
p.UE_PWR_HEADROOM_PUSCH_LEVEL13+
p.UE_PWR_HEADROOM_PUSCH_LEVEL14+
p.UE_PWR_HEADROOM_PUSCH_LEVEL15+
p.UE_PWR_HEADROOM_PUSCH_LEVEL16+
p.UE_PWR_HEADROOM_PUSCH_LEVEL17+
p.UE_PWR_HEADROOM_PUSCH_LEVEL18+
p.UE_PWR_HEADROOM_PUSCH_LEVEL19+
p.UE_PWR_HEADROOM_PUSCH_LEVEL20+
p.UE_PWR_HEADROOM_PUSCH_LEVEL21+
p.UE_PWR_HEADROOM_PUSCH_LEVEL22+
p.UE_PWR_HEADROOM_PUSCH_LEVEL23+
p.UE_PWR_HEADROOM_PUSCH_LEVEL24+
p.UE_PWR_HEADROOM_PUSCH_LEVEL25+
p.UE_PWR_HEADROOM_PUSCH_LEVEL26+
p.UE_PWR_HEADROOM_PUSCH_LEVEL27+
p.UE_PWR_HEADROOM_PUSCH_LEVEL28+
p.UE_PWR_HEADROOM_PUSCH_LEVEL29+
p.UE_PWR_HEADROOM_PUSCH_LEVEL30+
0.001)

RSRP-KPI: Information relating to received signal level; ratio of worst signal level samples to all signal level samples; can be calculated as: samples where signal level >−90 dB/all signal level samples Timing advance (TA): distance from base station site in kilometers Number of all TA samples For GSM technology, the following thresholds may be used for checking if there is an antenna related performance problem:

1) Ue-KPI: samples >5000 and 15 km<TA<25 km and Ue-KPI>99.7%
2) Ue-KPI: samples >5000 and 5 km<TA<15 km and Ue-KPI>99.0%
3) Ue-KPI: samples >5000 and TA<5 km and Ue-KPI>96%
4) RSRP-KPI: samples >5000 and 3 km<TA<5 km and RSRP-KPI<−80 dB
5) RSRP-KPI: samples >5000 and 0.5 km<TA<3 km and RSRP-KPI<−78 dB
6) RSRP-KPI: samples >5000 and TA<0.5 km and RSRP-KPI<−75 dB For LTE technology, the following thresholds may be used for checking if there is an antenna related performance problem:

1) Ue-KPI: samples >5000 and 15 km<TA<25 km and Ue-KPI<−11 dB
2) Ue-KPI: samples >5000 and 5 km<TA<15 km and Ue-KPI<−7 dB
3) Ue-KPI: samples >5000 and TA<5 km and Ue-KPI<−5 dB
4) RSRP-KPI: samples >5000 and 3 km<TA<5 km and RSRP-KPI<5%
5) RSRP-KPI: samples >5000 and 0.5 km<TA<3 km and RSRP-KPI<10%
6) RSRP-KPI: samples >5000 and TA<0.5 km and RSRP-KPI<20%

If the same thresholds are triggered both in GSM and LTE (and GSM and LTE use the same antenna line) it is likely that there is an antenna problem in the respective antenna line and responsively an indication of an antenna problem is output in an embodiment. For example, is the thresholds labelled as 1) are triggered both in GSM and LTE an indication of an antenna problem is output, or if the thresholds labelled as 2) are triggered both in GSM and LTE an indication of an antenna problem is output etc.

It is to be noted that embodiments of the invention are not limited solely to the examples listed here. A skilled person understands that there may be variation in the thresholds and that definition of the thresholds and the KPIs (e.g. the Ue-KPI and the RSRP-KPI) may vary depending on the network technology that is being used.

Without in any way limiting the scope, interpretation, or application of the claims appearing below, a technical effect of one or more of the example embodiments disclosed herein is ability to dynamically analyze antenna operation and to detect problem situations in a timely and adaptive manner. The results thus obtained may be used for network management operations and consequently network performance may be improved.

Another technical effect of one or more of the example embodiments disclosed herein is ability to analyze antenna operation based on data that is easily available. Thereby the solution is easy to implement and reliable to follow.

Another technical effect of one or more of the example embodiments disclosed herein is ability to automatically detect network problems that may cause degraded user experience but do not trigger conventional network alarms.

Yet another technical effect of one or more of the example embodiments disclosed herein is ability to automatically identify root cause for performance problems instead of needing to analyze and resolve secondary problem indications caused by the root cause.

If desired, the different functions discussed herein may be performed in a different order and/or concurrently with each other. Furthermore, if desired, one or more of the before-described functions may be optional or may be combined.

Although various aspects of the invention are set out in the independent claims, other aspects of the invention comprise other combinations of features from the described embodiments and/or the dependent claims with the features of the independent claims, and not solely the combinations explicitly set out in the claims.

It is also noted herein that while the foregoing describes example embodiments of the invention, these descriptions should not be viewed in a limiting sense. Rather, there are several variations and modifications, which may be made without departing from the scope of the present invention as defined in the appended claims.

The invention claimed is:

1. A computer implemented method of antenna analysis for a base station site of a communication network, wherein the base station site serves at least a cell operating according to a first network technology and a cell operating according to a second network technology, the method comprising:
receiving, from the base station site, performance data related to the first network technology and performance data related to the second network technology;
analyzing the received performance data to check if the performance data indicates an antenna related performance problem; and
outputting an indication of an antenna problem responsive to detecting an antenna related performance problem both in the performance data related to the first network technology and the performance data related to the second network technology, wherein
the antenna problem is not indicated if the antenna related performance problem is detected only in the performance data related to the first network technology or only in the performance data related to the second network technology.

2. The method of claim 1, wherein one antenna line in the base station site serves the cell operating according to the first network technology and the cell operating according to the second network technology, and the indication of an antenna problem indicates a problem in said antenna line.

3. The method of claim 1, wherein different antenna lines in the base station site serve the cell operating according to the first network technology and the cell operating according to the second network technology, and the indication of an antenna problem indicates a problem in whole antenna.

4. The method of claim 1, wherein one antenna line in the base station site serves the cell operating according to the first network technology and the cell operating according to the second network technology, and absence of an antenna related performance problem in the performance data related to the first network technology or the performance data related to the second network technology results in outputting an indication of no antenna problem.

5. The method of claim 1, wherein outputting the indication of an antenna problem requires detecting substantially similar antenna related problem both in the performance data related to the first network technology and the performance data related to the second network technology.

6. The method of claim 1, wherein the performance data comprises at least information relating to signal levels.

7. The method of claim 6, wherein the information relating to signal levels comprises at least information relating to signal levels received at user device locations and/or information relating to transmission powers used by user devices in the respective cell.

8. The method of claim 6, wherein the performance data further comprises information relating to distance of user device locations from the base station site.

9. The method of claim 6, wherein the detection of the antenna related performance problem is based on comparing the information relating to signal levels to predefined thresholds.

10. The method of claim 9, wherein the thresholds depend on distance of the user device locations from the base station site.

11. The method of claim 9, wherein the detection of the antenna related performance problem is further based on detecting that certain number or certain percentage of user device locations trigger the threshold(s).

12. The method of claim 1, wherein the detection of the antenna related performance problem is based on detecting that number of user device locations experiencing bad field conditions and/or using increased transmission power exceeds a threshold.

13. The method of claim 1, wherein the detection of the antenna related performance problem is based on detecting a plurality of user device locations closer to the base station site than outer border of the respective cell using increased transmission power.

14. The method of claim 1, wherein the detection of the antenna related performance problem is based on detecting that number of user device locations experiencing good field conditions does not reach a threshold.

15. An apparatus comprising:
a processor, and
a memory including computer program code; the memory and the computer program code configured to, with the processor, cause the apparatus to perform antenna analysis for a base station site of a communication network, wherein the base station site serves at least a cell operating according to a first network technology and a cell operating according to a second network technology, by performing
receiving, from the base station site, performance data related to the first network technology and performance data related to the second network technology;
analyzing the received performance data to check if the performance data indicates an antenna related performance problem; and
outputting an indication of an antenna problem responsive to detecting an antenna related performance problem both in the performance data related to the first network technology and the performance data related to the second network technology, wherein
the antenna problem is not indicated if the antenna related performance problem is detected only in the performance data related to the first network technology or only in the performance data related to the second network technology.

16. The apparatus of claim 15, wherein outputting the indication of an antenna problem requires detecting substantially similar antenna related problem both in the performance data related to the first network technology and the performance data related to the second network technology.

17. The apparatus of claim 15, wherein the detection of the antenna related performance problem is based on detecting that number of user device locations experiencing bad field conditions and/or using increased transmission power exceeds a threshold.

18. The apparatus of claim 15, wherein the detection of the antenna related performance problem is based on detecting a plurality of user device locations closer to the base station site than outer border of the respective cell using increased transmission power.

19. The apparatus of claim 15, wherein the detection of the antenna related performance problem is based on detecting that number of user device locations experiencing good field conditions does not reach a threshold.

20. A non-transitory memory medium comprising computer executable program code which when executed by a processor causes an apparatus to perform antenna analysis for a base station site of a communication network, wherein the base station site serves at least a cell operating according to a first network technology and a cell operating according to a second network technology, by performing receiving, from the base station site, performance data related to the first network technology and performance data related to the second network technology;

analyzing the received performance data to check if the performance data indicates an antenna related performance problem; and outputting an indication of an antenna problem responsive to detecting an antenna related performance problem both in the performance data related to the first network technology and the performance data related to the second network technology, wherein the antenna problem is not indicated if the antenna related performance problem is detected only in the performance data related to the first network technology or only in the performance data related to the second network technology.

\* \* \* \* \*